US012562331B2

(12) United States Patent
Reus et al.

(10) Patent No.: US 12,562,331 B2
(45) Date of Patent: Feb. 24, 2026

(54) EXTRACTION GRID

(71) Applicant: BÜHLER ALZENAU GMBH, Alzenau (DE)

(72) Inventors: Holger Reus, Freigericht (DE); Daniel Reppin, Greifenstein (DE); Dirk Müller, Neuberg (DE); Simon Liu, Seligenstadt (DE); Harro Hagedorn, Frankfurt (DE)

(73) Assignee: BÜHLER ALZENAU GMBH, Alzenau (DE)

( * ) Notice: Subject to any disclaimer, the term of this patent is extended or adjusted under 35 U.S.C. 154(b) by 169 days.

(21) Appl. No.: 18/254,544

(22) PCT Filed: Nov. 19, 2021

(86) PCT No.: PCT/EP2021/082318
§ 371 (c)(1),
(2) Date: May 25, 2023

(87) PCT Pub. No.: WO2022/112130
PCT Pub. Date: Jun. 2, 2022

(65) Prior Publication Data
US 2024/0021399 A1 Jan. 18, 2024

(30) Foreign Application Priority Data
Nov. 26, 2020 (EP) .................................... 20210012

(51) Int. Cl.
*H01J 27/02* (2006.01)
*H01J 37/32* (2006.01)

(52) U.S. Cl.
CPC ...... *H01J 27/024* (2013.01); *H01J 37/32422* (2013.01); *H01J 2229/482* (2013.01); *H01J 2237/332* (2013.01)

(58) Field of Classification Search
CPC .... H01J 37/3255; H01J 37/147; H01J 27/024; H01J 37/32697; H05H 1/54
See application file for complete search history.

(56) References Cited

U.S. PATENT DOCUMENTS 6,050,217 A * 4/2000 Li ..................... H01J 37/32697
118/723 E
2010/0206713 A1 8/2010 Li et al.
(Continued)

FOREIGN PATENT DOCUMENTS

DE 102004011118 A1 10/2005
EP 0349556 B1 11/1993
WO WO-2004091264 A2 * 10/2004 ............... H05H 1/54

OTHER PUBLICATIONS

N/a. "Streckmetall" Wikipedia, Oct. 14, 2020 (Oct. 14, 2020), pp. 1-4, Retrieved from the Internet: https://de.wikipedia.org/w/index.php?title=Streckmetall&oldid=204542016 [retrieved on Apr. 29, 2021] XP055800028; abstract p. 1, last paragraph.

*Primary Examiner* — Andrew J Bowman
(74) *Attorney, Agent, or Firm* — Colson Law Group, PLLC

(57) ABSTRACT

A device for extracting ions and/or electrons from a plasma has a grid (1) and a grid holder (2), on the circumference of which the grid (1) is fastened. According to the invention, the grid (1) is configured as an expanded metal grid. The invention further also provides a plasma source, a plasma coating device, and a method for producing an interference layer or interference layer systems.

17 Claims, 9 Drawing Sheets

(56)         References Cited

U.S. PATENT DOCUMENTS

2011/0214814 A1      9/2011  Iizuka et al.
2015/0287567 A1*  10/2015  Tsujiyama ............ H01J 37/147
                                                        156/345.35
2016/0276134 A1*   9/2016  Collins ............. H01L 21/67213

* cited by examiner

31

—●—181 R450N 0.5h    —●—182 R450 11.1h    —○—187 R450N 54.1h    ---●---194 R450N 67.3h

---●---195 R450N 81.8h*    ☀☀198 R450N 94.9h*    ·-■-·199 R450N 95.7h —×—200 R450N 143.3h

—☀—201 R450N 154.6h

39

SL SiO2 UV: Mesh (Ti/Ta) vs grid (Ti/Zr)

——— SUPRASIL_uncoated_T    —·—·— SL_SiO2_Zr-Grid_T

·········· SL_SiO2_Ti-Grid_T    ·—··—·· SL_SiO2_Ti-Mesh_T

SL SiO2 UV: Mesh (Ti/Ta) vs grid (Ti/Zr)

EXTRACTION GRID

The invention relates generally to plasma jet sources which are used, for example, in vacuum coating methods, and in particular an extraction device for extracting ions and/or electrons from a plasma.

In many methods for treating surfaces, for example coating, structuring or etching, a plasma is used to produce ions of certain materials, in particular gases, with the aid of which the methods are carried out. Therefore, for example, in vacuum coating methods, a plasma source can be used from which charged particles are extracted which can then be used for removing a surface or also for vapor deposition on a surface, for example for applying an oxide layer. In this case, the plasma can be generated for example capacitively, i.e., in an electric alternating field, inductively, or by microwaves. The charged particles, i.e., in particular ions or electrons, can be extracted from the plasma with the aid of an electrode.

To extract the ions or electrons from the plasma, it is known to use a metal grid or metal mesh.

In this context, EP 0 349 556 BI describes a device for removing surface layers by particle bombardment from a plasma in which the surfaces of the electrodes are selected such that almost the entire high-frequency voltage drops at the one extraction electrode designed as a fine grid to achieve a homogeneous bombardment over as large an area as possible of surfaces with atomic or molecular ion beams of a high parallelism. This electrode is designed as a suitably configured wire mesh in the form of wires running in parallel.

Furthermore, DE 10 2004 011 118 A1 describes an extraction electrode for a plasma beam source, wherein the extraction electrode is designed as a circular carrier plate with a pinhole pattern.

To maintain the homogeneity of the beam of extracted ions and/or electrons, it is essential to keep the shape of the extraction grid constant as long as possible since the shape significantly influences the beam of the extracted ions and electrons from the plasma. Especially with the grids used in the prior art, the longevity and therefore the process stability is a problem since the longevity of the electrode is impaired by the thermal expansion of the various materials and systems caused during the irradiation. The thermal expansion produces in particular a mechanical deformation of the grid and therefore has a very negative influence on the distribution of the ions/electrons and therefore of the coating properties.

It is therefore an object of the present invention to provide an extraction device which can ensure a uniform distribution of the ions/electrons that is stable over the long-term.

This object is achieved with the extraction device, the plasma source, the plasma coating device and the method according to the appended claims; the dependent claims describe embodiments of the present invention.

The present invention provides an extraction device for extracting ions and/or electrons from a plasma. The device has a grid and a grid holder, on the circumference of which the grid is fastened. According to the invention, the grid is designed as an expanded metal grid. In a plan view, the device preferably has a substantially circular shape.

The grid holder can have a main body and a clamping ring with which the expanded metal grid is fastened to the main body. Furthermore, a spacer can be arranged between the main body and the clamping ring.

The expanded metal grid attached to the grid holder preferably forms a three-dimensionally curved surface which generally substantially constitutes a cylindrical surface. The radii of curvature can be symmetrical around the apex. According to an embodiment, the two radii of curvature can also differ on the sides of the apex so that an asymmetrical shape of the grid around the apex is formed.

Especially in the case of an asymmetrical cylindrical surface, the apex can in particular be offset or tilted from the center of the grid. Additionally or alternatively, the radii of curvature of the main directions and/or the radii of curvature within the main directions can also differ.

An electrically conductive metal, in particular metals whose oxides are optically transparent and/or likewise used in the deposited layers, can be used as the material for the grid. Examples include titanium, tantalum, hafnium, aluminum, zirconium, niobium, their alloys, and stainless steel. The grid can further be coated with an oxide, in particular aluminum oxide, which is optically transparent and significantly increases the lifetime of the grid, since it reduces the erosion rate of the grid by the plasma ion bombardment.

Exemplary dimensions of the grid are a thickness of 0.05 mm to 3 mm, a diameter of about 10 cm to 50 cm, in particular of 30 cm, a mesh length of 0.5 mm to 10 mm, a mesh width of 0.5 mm to 10 mm, a strand width of 0.1 mm to 10 mm, and/or a strand thickness of 0.1 mm to 10 mm.

The invention further provides a plasma source comprising a plasma chamber, a gas supply for supplying a gas into the plasma chamber, a device for generating a plasma within the plasma chamber, and the device according to the invention for extracting ions and/or electrons from the plasma. The holder of the extraction device should close the source RF radiation-tight. The grid should in particular make electrical contact and be slidingly mounted at the same time.

The plasma source can be used in particular in a coating device, in particular with methods such as electron beam evaporation, thermal evaporation, sputtering or plasma-enhanced chemical evaporation deposition, wherein a substrate holder for holding the substrates to be coated is arranged opposite the plasma source. The substrate holder preferably has a surface which is curved substantially concavely with respect to the plasma source or is also planar. The substrate holder can also have a planetary arrangement with a planar or concavely curved surface, wherein one or more substrates to be coated are arranged on the surface.

The grid of the device for extraction is preferably shaped such that the plasma distribution on the surface of the substrate holder is substantially uniform.

The substrate holder can be arranged approximately 50 cm to 200 cm, preferably 80 cm away from the plasma source. The radius of curvature of the substrate holder can be approximately 80 cm to 150 cm, preferably 130 cm.

The invention further provides a method for producing an interference layer or interference layer systems, in particular using the device according to the invention for extracting ions and/or electrons from a plasma. The method allows the production of layers with a very homogeneous distribution of the layer properties over the entire substrate holder, wherein the deviation of the plasma distribution, measured for example as an etching rate of $SiO_2$, from the average value is not more than 10%.

The invention will be further described below with reference to the figures.

Figure 2A:
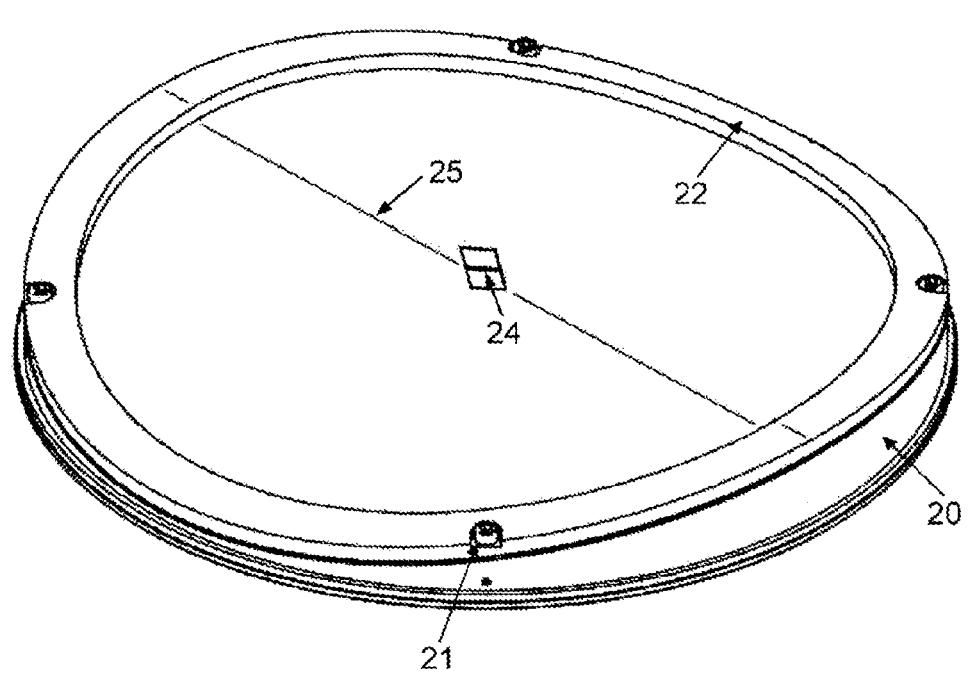
FIG. 2a shows a technical drawing of the grid holder according to an embodiment of the invention.
Figure 2B:
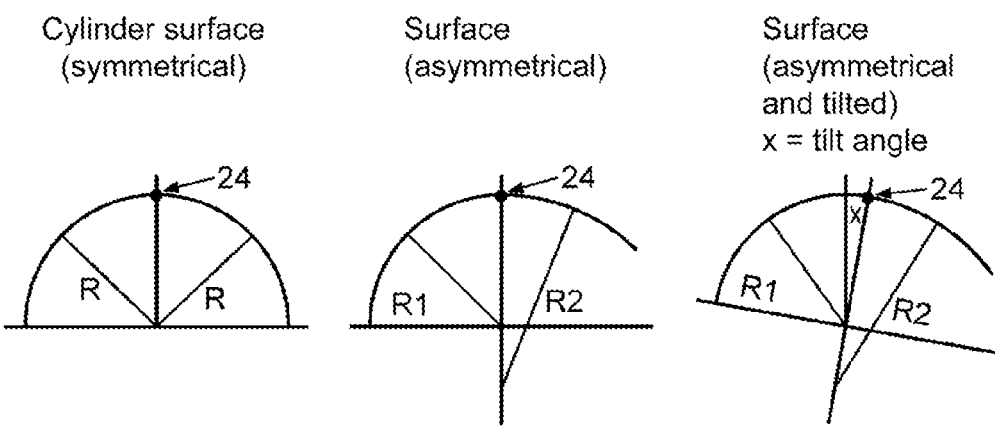

FIG. 2b schematically shows the curvature variants of the grid.

Figure 3:
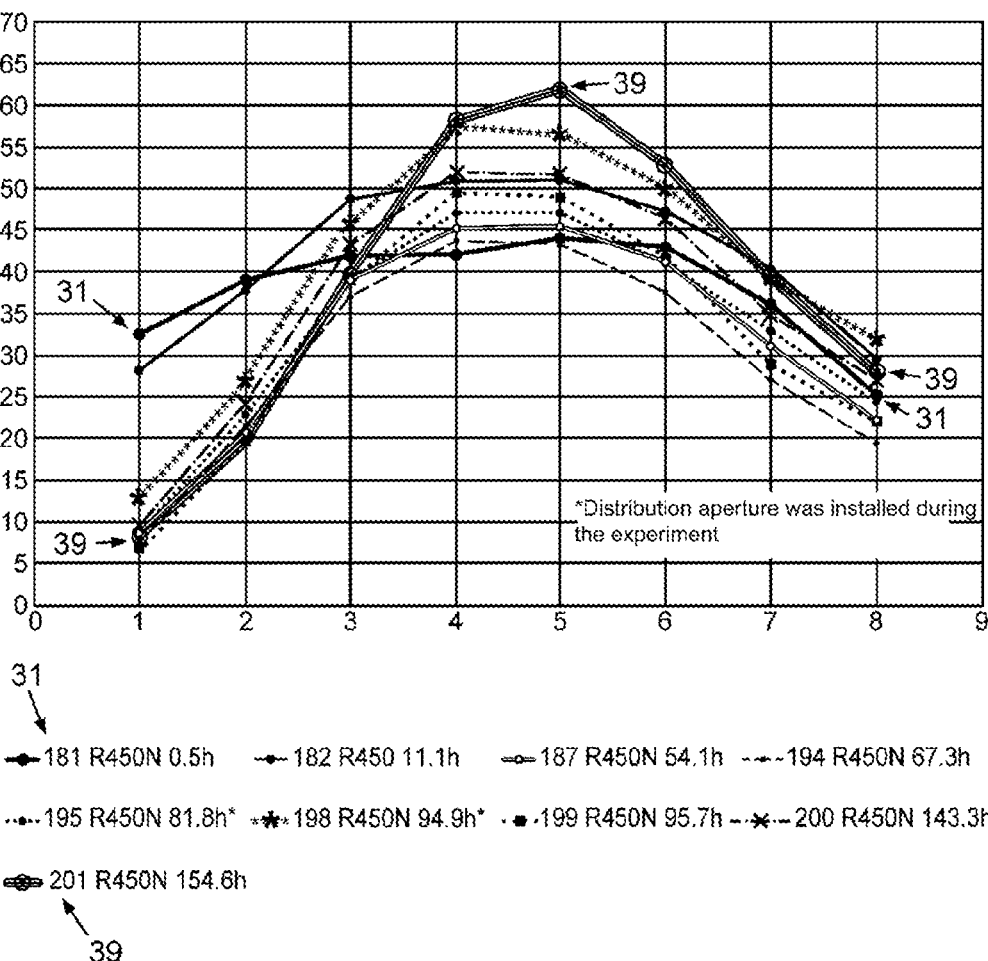

FIG. 3 shows a diagram of the etching rate over the position for an extraction electrode of the prior art with a grid.

Figure 4:
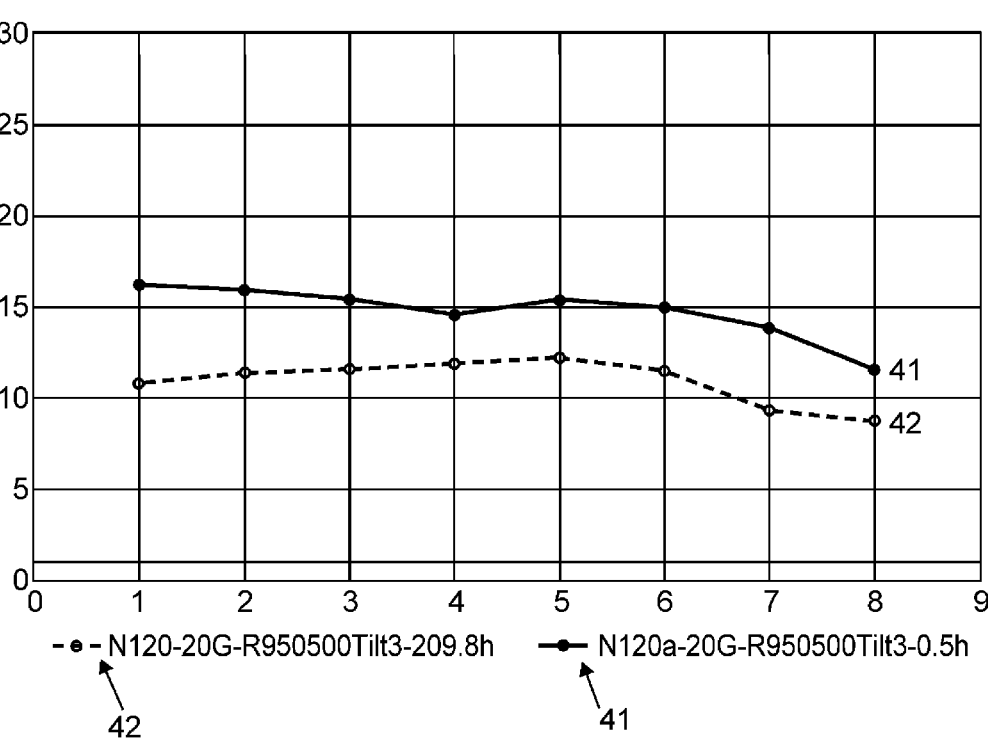

FIG. 4 shows the distribution of the etching rate for a device according to an embodiment of the invention on a calotte with the radius of curvature of 107 cm.

Figure 5A:
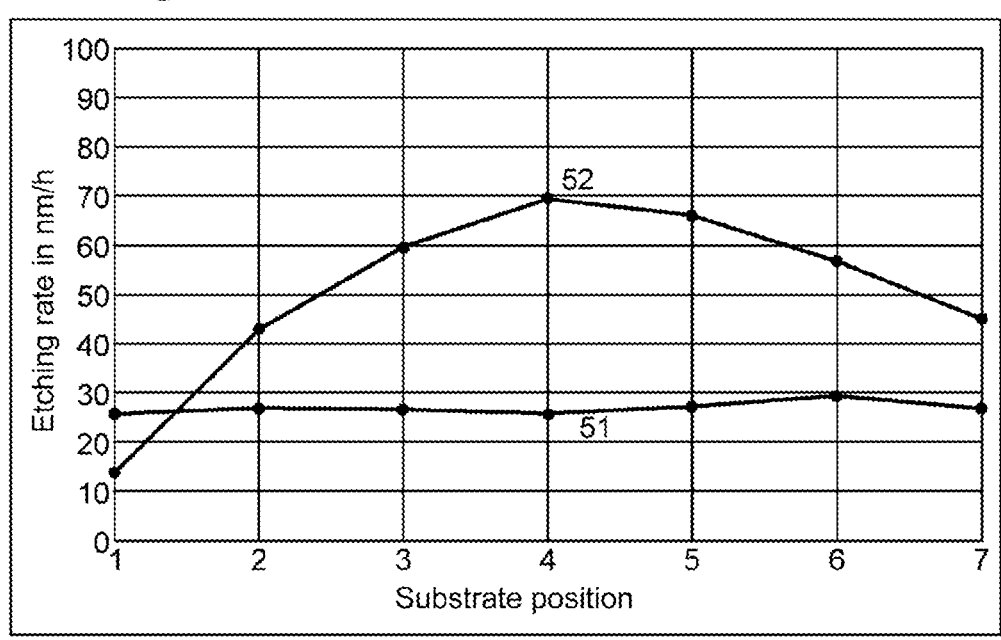

FIG. 5*a* shows the comparison of the etching rate over the position for the extraction electrode of the prior art with a grid for the etching rate for a device according to an embodiment of the invention on a calotte with a radius of curvature 130 cm.

Figure 5B:
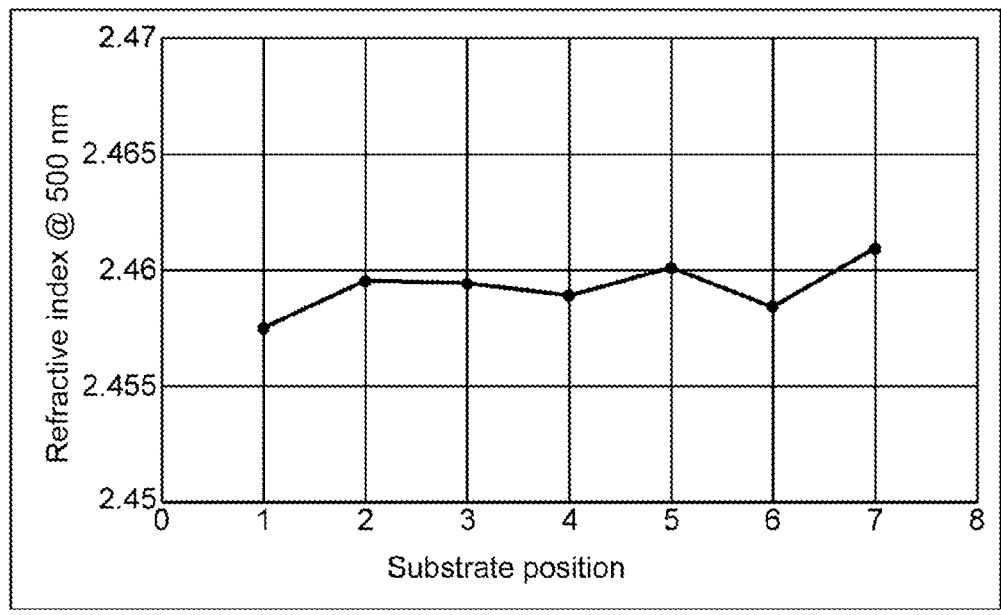

FIG. 5*b* shows the distribution of the refractive index of $TiO_2$ which can be achieved on the calotte with the invention described here.

Figure 6:
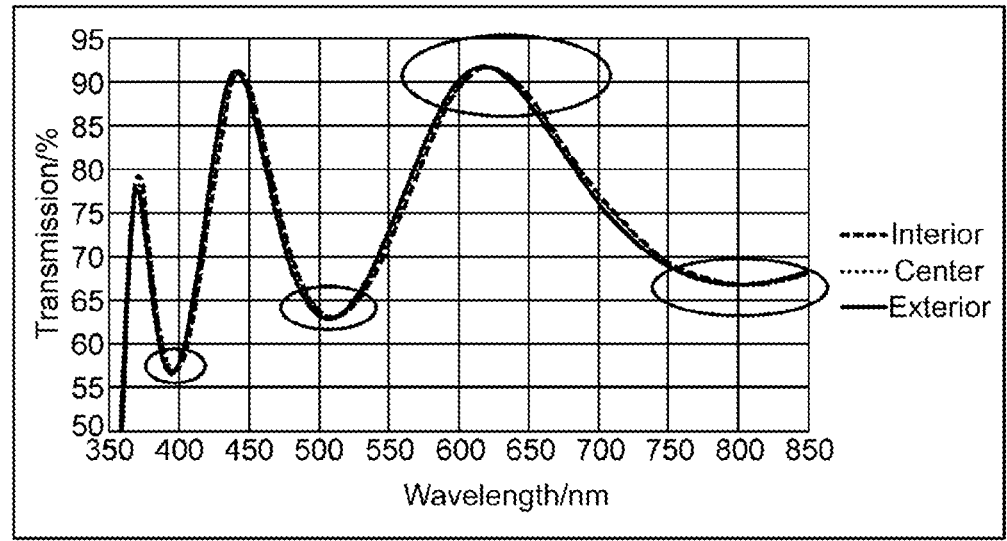

FIG. 6 shows the spectral curves achieved with the device according to the embodiment of the invention of a $TiO_2$ single layer on substrates positioned along the calotte radius and corresponding to the desired uniform distribution.

Figure 7:
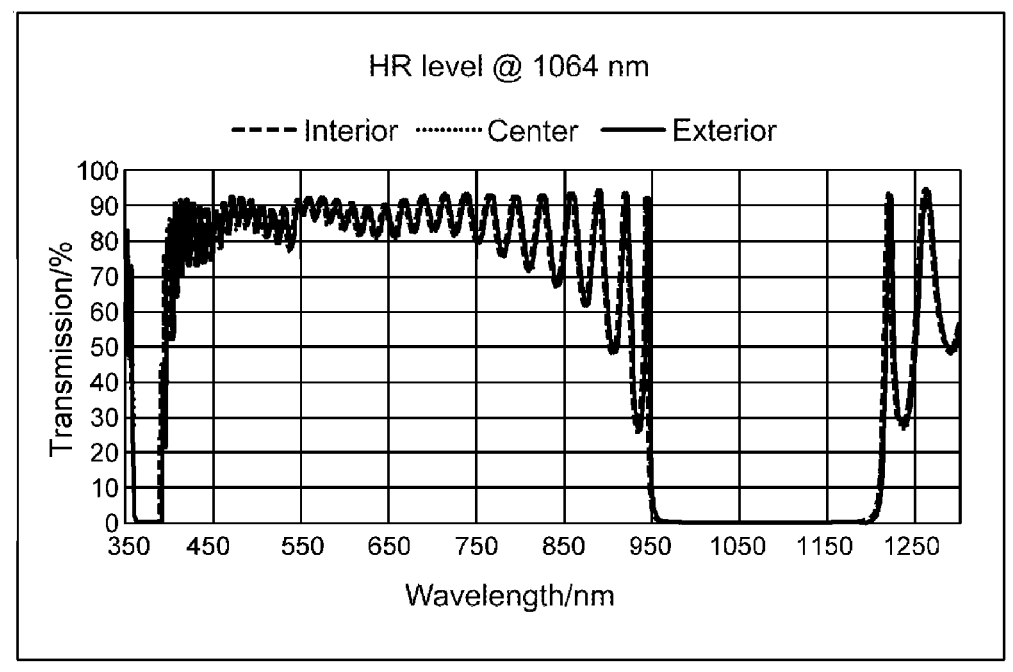

FIG. 7 shows the spectral curves of an interference layer system achieved with the device according to the embodiment of the invention on substrates which were positioned along the calotte radius and correspond to the desired, uniform distribution.

Figure 8:
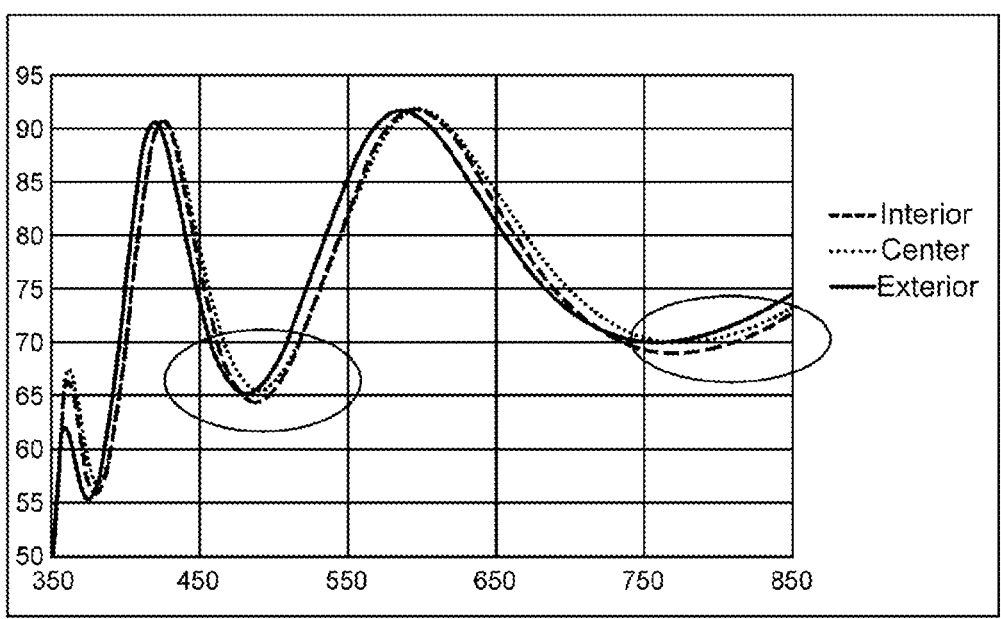

FIG. 8 shows an example of an undesired distribution based on a $TiO_2$ single layer as achieved with the prior art mesh holder.

Figure 9:
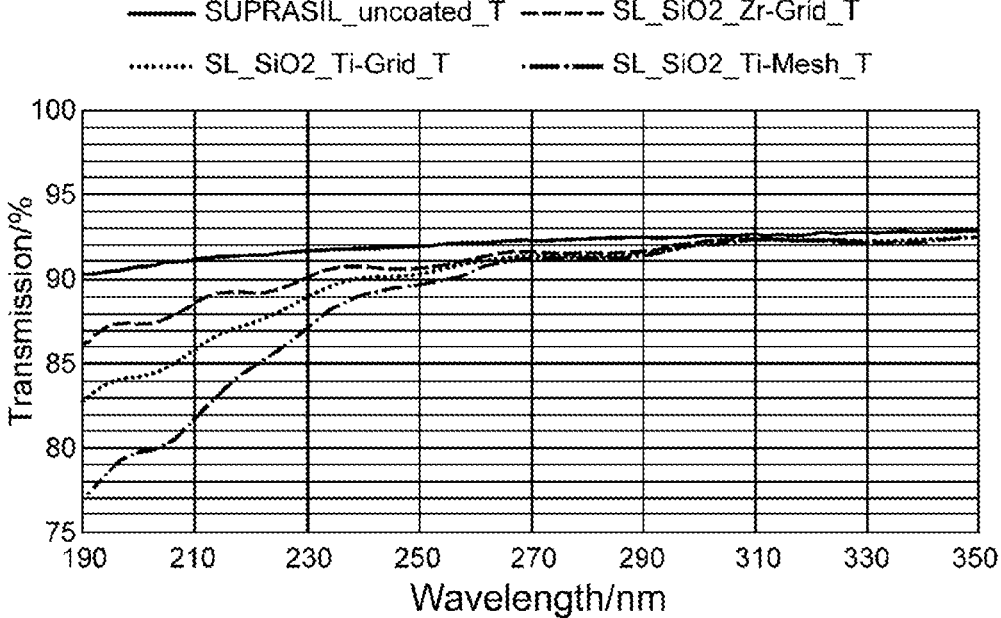

FIG. 9 shows the transmission of a $SiO_2$ layer in the UV range for an uncoated substrate, a zirconium grid, a titanium site and a titanium mesh.

Figure 10:
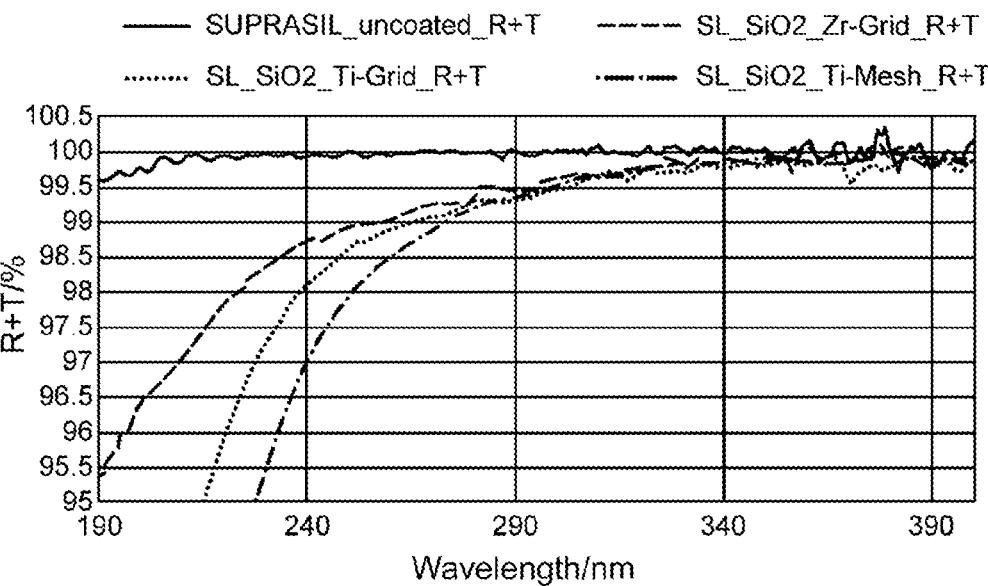

FIG. 10 shows the sum of the reflection and transmission of the $SiO_2$ layers shown in FIG. 9.

Figure 1:
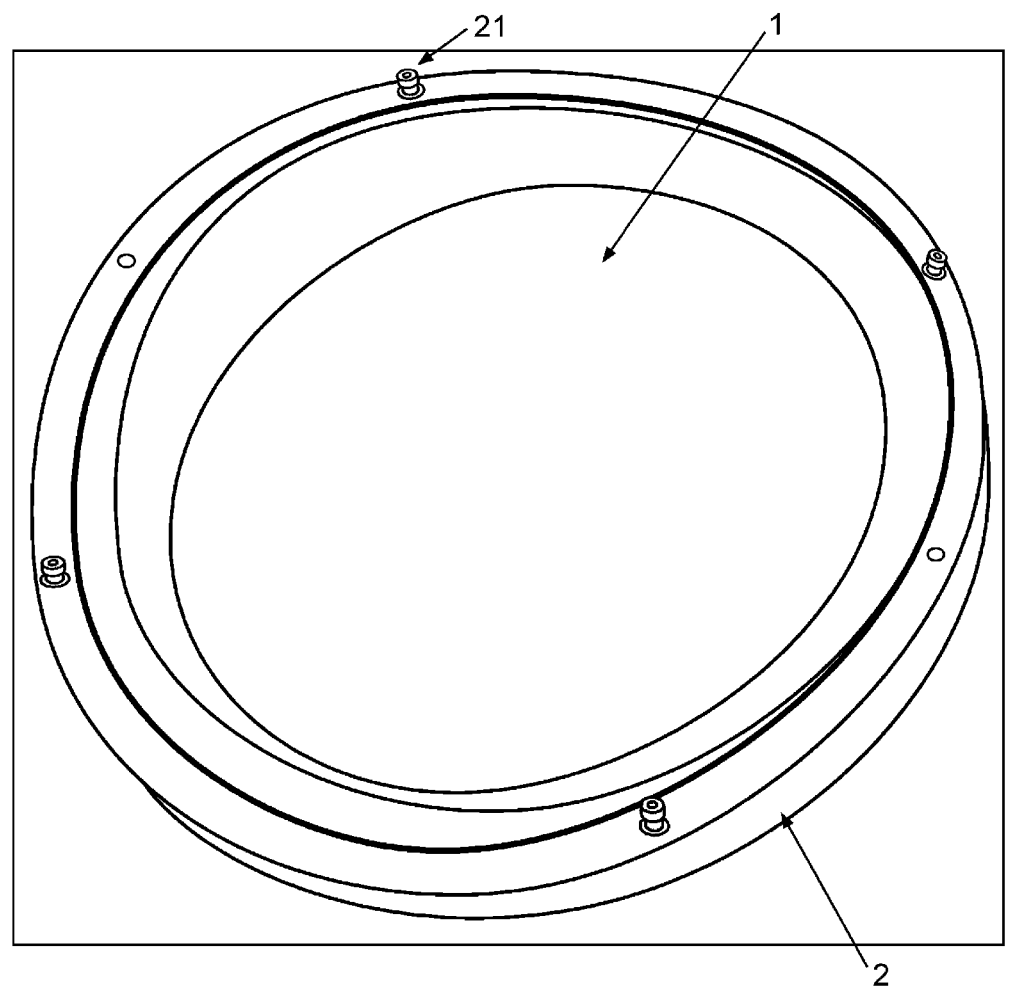
FIG. 1 shows a photograph of the device according to an embodiment of the invention with grid holders and expanded metal grids attached thereto.

The extraction device, as shown in FIG. 1, has a grid holder 2 which substantially dictates the shape of the extraction device. A round or oval grid 1 is fastened on the grid holder 2. In particular, the grid holder 2 is shaped such that the grid 1 fastened thereon has a circular shape in plan view and forms a three-dimensionally curved surface, which preferably substantially represents a cylindrical surface. The cylindrical surface can be curved symmetrically around the apex. However, it can also be advantageous for the cylindrical surface to have different radii of curvature around the apex, i.e., it is asymmetrically curved. In the embodiment shown in FIG. 1, the grid 1 which is designed as an expanded metal grid is fastened to the grid holder by four screws 21. According to an embodiment, the grid holder can have a main body and a clamping ring (not shown in FIG. 1). Optionally, a spacer can be arranged between the main body and the clamping ring. The spacer ensures that the expanded metal rests slidingly on the RF seal of the main body, and the thermal expansion can be compensated without the shape of the grid and therefore the plasma distribution being changed by deformation.

The grid holder is shown again schematically in FIG. 2*a*. Here, the main body 20, the screws 21 and the clamping ring 22 are shown. The shape of the grid holder 2 is such that a grid arranged thereon is curved about the apex line 25 and therefore essentially forms a cylindrical surface. This apex line 25, and therefore the apex 24, can be centered in the grid holder forming a ring, or offset or tilted from the center. The radii of curvature to the side of the apex 24 can be identical or also different, as shown in FIG. 2*b*. Here, a symmetrical arrangement, an asymmetrical arrangement with different radii of curvature on the right and left of the apex 24 and an asymmetrical and additionally tilted arrangement, in which the apex 24 is arranged offset from the center, are shown schematically.

A spacer which is optionally provided between the main body 20 and the clamping ring 22 can prevent the grid from being firmly tightenable on the main body 20. It is therefore possible for the grid to expand flat between the main body 20 and the clamping ring 22 without adversely affecting a plasma distribution.

The formation of the grid in the form of an expanded metal grid ensures a uniform distribution of the ions stable over the long-term on a substrate holder arranged opposite the plasma source. As a rule, the substrates are arranged opposite the plasma source on a substrate holder, for example in the form of a calotte which is concavely curved with respect to the plasma source. The substrate holder can also have a planar shape. For an optimal distribution, the curvature of the grid must be adapted to the shape of the calotte functioning as a substrate holder.

The adaptation of the grid to the employed calotte is reflected in diagrams which, for example, have an etching rate of $SiO_2$ over the surface of the calotte as shown in FIGS. 3 and 4. An optimal, i.e., homogeneous distribution of the ion current would be represented in these diagrams as a horizontal line over the entire extension of the calotte.

FIG. 3 shows the etching rate over the extension of the calotte (radius of curvature: 107 cm) for different durations of use, indicated as operating hours, when using a previously known mesh, i.e., a wire grid according to the prior art. While the distribution appears still acceptable at the beginning (reference number 31, after half an hour of operation), the distribution changes drastically even after a few hours and is considerably worse after an operating time of 154.6 hours (reference number 39). In particular, the etching rate in the center of the calotte is higher by a factor of 3 to 10 than at the edges of the calotte which would lead to an uneven distribution on the substrate depending on its arrangement on the calotte.

For comparison, FIG. 4 shows the service life of a grid holder according to an embodiment of the present invention. Here, it is shown that the distributions are very similar at the beginning (reference number 41, after half an hour of operation) and after about 210 hours (reference number 42). In particular, the distribution over the extent of the calotte (radius of curvature: 107 cm) is largely homogeneous; only the absolute etching rates are not identical which can be explained by the varying cleaning state of the system.

FIG. 5 shows the distribution of the etching rate over the position of a substrate holder with a radius of curvature of 130 cm, that is to say a lesser curvature than the calotte used in FIGS. 3 and 4. Here, an even better distribution is revealed with the grid holder shown here with the expanded metal mesh according to the invention (reference number 51) compared to the use of a conventional grid holder (reference number 52). The distribution of the refractive index shown in FIG. 5*b* at 500 nm over the position on the calotte results from the etching rate shown in FIG. 5*a* using the grid holder with the expanded metal mesh. The etching rate shown in FIG. 5*a* is, on average, 26.9 nm/h with a minimum of 25.6 nm/h (deviation of −4.6%) and a maximum of 29.3 nm/h (deviation of 9.2%). In general, the distribution of the etching rate is within a range of ±10%. The distribution of the refractive index for $TiO_2$ shown in FIG. 5*b* can therefore be achieved with an average value of 2.4592, a minimum of 2.4575 and a maximum of 2.4609, i.e., a deviation of approximately ±0.1%.

FIG. 6 shows by way of example the distribution over the calotte with a radius of curvature of 130 cm for a single interference layer of $TiO_2$ on a glass substrate. It is shown here that the spectral curves for substrate positions along the calotte radius lie almost one on top of the other; that is to say a very good, uniform distribution can be achieved. The correspondence of the transmission values of the minima and maxima reflects the good refractive index distribution.

FIG. 7 shows the distribution of an interference layer system of $TiO_2$ and $SiO_2$ over the calotte with a 130 cm radius of curvature. Here, the very good distribution can also be shown by the superposition of the curves.

FIG. 8 shows the example of a poor refractive index distribution. The transmission values of the minima are very different. This difference can be attributed to a poor plasma distribution on the calotte, as results from the use of a wire grid holder/mesh holder of the prior art.

The grid according to one embodiment of the present invention can therefore be used to achieve a uniform distribution of the extracted ions/electrons in a plasma-assisted treatment system, for example a coating system. The uniform distribution is maintained over more than 200 hours of operation, whereas the distribution when using a grid holder according to the prior art does not remain constant (see FIG. 3).

This longevity is due on the one hand to the holder structure which allows the expanded metal grid to expand uniformly. In contrast, the wires used in the prior art extraction grid lose tension by thermal expansion and cannot uniformly maintain the saddle shape formed at the beginning. This produces a serious negative influence on the obtained layer properties, especially on the outer positions of the calotte where most of the substrates are located due to the concave curved shape. The dimensional stability of the grid holder according to the present invention is achieved in that the grid holder is designed such that the grid fastened thereon can expand but retains its shape and does not deform in an uncontrolled manner. The shape, i.e., the radius of curvature of the grid, is adapted here for an optimal distribution of the plasma. The uniform distribution can be influenced by the shape of the grid holder used according to the invention. This shape, and thereby the plasma distribution, remains the same over many operating hours, wherein the inclusion of the RF radiation is ensured at the same time. The device therefore seals the source RF radiation-tight.

On the other hand, the use of an expanded metal for the grid represents a significant factor for the dimensional stability. An expanded metal is produced by stretching a metal sheet provided with generally staggered cuts. In the use in the present invention, an electrically conductive metal is preferably used for the expanded metal, in particular titanium, tantalum, hafnium, aluminum, zirconium, niobium, their alloys and stainless steel. The grid can furthermore be coated with an oxide, in particular aluminum oxide. In this case, however, the edge of the grid must be free of coating to ensure the electrical contact.

The resulting expanded metal grid provides electrical conductivity and dimensional stability, as well as a uniform thermal expansion which is guided through the holder. The shape of the expanded metal also minimizes the support surface on the holder and therefore the heat dissipation to the holder. The temperature gradient across the grid is therefore minimized.

With the employed grid sources, grids or meshes made of tungsten, molybdenum or titanium are typically used. Since the grid material is also removed and incorporated into the coating, these materials and their oxides cause impurities in a range of less than 300 nm and produce undesired absorption or losses in the layer properties. We could solve this problem with an expanded metal grid made of zirconium on the new grid holder. FIG. 9 shows the comparison between a zirconium grid, the standard titanium grid, and the titanium mesh. In particular, FIG. 9 shows the transmission of an $SiO_2$ layer in the UV range for an uncoated substrate (Suprasil uncoated as a solid line), a zirconium grid, a titanium grid and a titanium mesh (each with different types of dashes). It can be clearly seen that the transmission of the layer produced with the zirconium grid is highest. The thickness of the deposited $SiO_2$ layer was about 600 nm ($7.1\lambda/4$ at 500 nm).

FIG. 10 again shows the sum of reflection and transmission of the $SiO_2$ layers shown in FIG. 9. Here, too, it is shown that the layer produced with the zirconium grid has higher values at wavelengths below 290 nm than the comparative layers with the titanium grid or titanium mesh.

A significant improvement in the layer transparency in the UV range can therefore be achieved by using a zirconium grid.

Such an extraction device is used in particular in a plasma source which is known to have a plasma chamber in which the plasma is generated in particular by applying an RF voltage, a gas supply for supplying the gas into the plasma chamber, and the extraction device according to the present invention. By applying a voltage to the grid of the extraction device, the charged ions or electrons are extracted from the plasma and accelerated in the direction of the substrates arranged opposite the plasma source on the substrate holder.

To produce the extraction device according to the invention, an expanded metal grid is provided, and the latter is suitably fastened on a grid holder. The shape of the grid holder here determines the shape of the grid, which is preferably curved as described above.

The extraction device and therefore the plasma source of the present invention can be used in the coating of substrates and in particular in the production of an interference layer or interference layer systems. For the fabrication of the interference layers or interference layer systems, a homogeneous distribution of the refractive indices of the deposited materials over the substrate holder is advantageous. This homogeneous distribution requires a uniform plasma jet across the substrate holder which is provided by the present invention.

The invention therefore provides in particular a grid holder for a plasma source which has been optimized in its shape in order to distribute the extracted plasma onto a rotating calotte in such a way that the plasma bombardment on the calotte is uniform over time for all substrates. This is shown in the distribution of the measured etching rates and the shown coating examples.

The grid holder is constructed in such a way that the employed grid, which is an expanded metal, can make a compensating movement if it is heated by the plasma without losing its shape relevant for the plasma distribution. For this purpose, the grid slides on a metallic RF seal, which also ensures the electrically necessary contact of the grid. A clamping ring is screwed onto the holder over defined spacers to shape and hold the grille. The spacers ensure that the grid can slide on the RF seal.

The invention claimed is:

1. A device for extracting ions and/or electrons from a plasma, having:

a grid designed as an expanded metal grid, a grid holder on which the grid is fastened on its circumference, the grid holder has a main body and a clamping ring with which the expanded metal grid is fastened to the main body, and a spacer is arranged between the main body and clamping ring, wherein by means of the spacer, the expanded metal grid rests, optionally in a sliding manner, on an RF seal of the main body, wherein the device substantially has a circular shape in plan view.

2. The device according to claim 1, wherein the expanded metal grid attached to the grid holder forms a three-dimensionally curved surface that is substantially a cylindrical surface that can have different radii of curvature, symmetrical as well as asymmetrical around the vertex.

3. The device according to claim 2, wherein the cylindrical surface is asymmetrical, wherein in particular the apex is offset/tilted from the center of the grid, and/or the radii of curvature of main directions and/or the radii of curvature within the main directions differ.

4. The device according to claim 1, wherein the grid has an electrically conductive metal.

5. The device according to claim 1, wherein the grid is coated by an oxide.

6. The device according to claim 1, wherein the grid has a thickness of 0.05 mm to 3 mm, a diameter of about 10 cm to 50 cm, a mesh length of 0.5 mm to 10 mm, a mesh width of 0.5 mm to 10 mm, a strand width of 0.1 mm to 10 mm, and/or a strand thickness of 0.1 mm to 10 mm.

7. A plasma source, having a plasma chamber, a gas supply for supplying a gas to the plasma chamber, a device for generating a plasma within the plasma chamber, and the device for extracting ions and/or electrons from the plasma according to claim 1, wherein the grid holder of the extraction device closes off the plasma chamber in an RF radiation-tight manner, and/or the grid is mounted in a sliding manner.

8. A coating device, having the plasma source according to claim 7, and a substrate holder arranged opposite the plasma source for holding substrates to be coated.

9. The coating device according to claim 8, wherein the substrate holder has a substantially concave curved or planar surface or planetary arrangement with a planar or concave curved surface with respect to the plasma source, wherein one or more substrates to be coated are arranged on the surface.

10. The coating device according to claim 9, wherein the grid of the device for extraction is shaped such that a plasma distribution on the surface of the substrate holder is substantially uniform.

11. The coating device according to claim 9, wherein the substrate holder is arranged at about 50 to 200 away from the plasma source, and/or has a radius of curvature of about 80 to 150 cm.

12. A method for producing an interference layer or interference layer systems using the device for extracting ions and/or electrons from a plasma recited in claim 1, by means of a coating method, optionally by electron beam evaporation, thermal evaporation, sputtering or plasma-enhanced chemical vaporisation deposition, wherein an applied layer has a homogeneous distribution, wherein a deviation of a plasma distribution, optionally measured as an etching rate of SiO2, from an average value is not more than 10%.

13. A method for producing an interference layer or interference layer systems using the device for extracting ions and/or electrons from a plasma recited in claim 7 and the plasma source, by means of a coating method, optionally by electron beam evaporation, thermal evaporation, sputtering or plasma-enhanced chemical vaporisation deposition, wherein an applied layer has a homogeneous distribution, wherein a deviation of a plasma distribution, optionally measured as an etching rate of $SiO_2$, from an average value is not more than 10%.

14. A method for producing an interference layer or interference layer systems using the device for extracting ions and/or electrons from a plasma recited in claim 1, a plasma source having:

a plasma chamber;

a gas supply for supplying a gas to the plasma chamber;

a device for generating a plasma within the plasma chamber, wherein the grid holder of the extraction device optionally closes off the plasma chamber in an RF radiation-tight manner, and/or the grid is mounted in a sliding manner; and, a substrate holder arranged opposite the plasma source for holding substrates to be coated, by means of a coating method, optionally by electron beam evaporation, thermal evaporation, sputtering or plasma-enhanced chemical vaporisation deposition, wherein an applied layer has a homogeneous distribution, wherein a deviation of a plasma distribution, optionally measured as an etching rate of $SiO_2$, from an average value is not more than 10%.

15. The device according to claim 4, wherein the electrically conductive metal may comprise at least one of: titanium, tantalum, hafnium, aluminum, zirconium, niobium, their alloys, and stainless steel.

16. The device according to claim 5, wherein the oxide is aluminum oxide.

17. The device according to claim 11, wherein the substrate holder is arranged at about 80 cm away from the plasma source, and/or has a radius of curvature of about 130 cm.

* * * * *